United States Patent [19]
Wedge

[11] Patent Number: 5,157,356
[45] Date of Patent: Oct. 20, 1992

[54] MONOLITHIC MICROWAVE INTEGRATED CIRCUIT VOLTAGE CONTROLLED HARMONIC OSCILLATOR WITH ISOLATION AMPLIFIERS

[75] Inventor: Scott W. Wedge, Upland, Calif.

[73] Assignee: Hughes Aircraft Company, Los Angeles, Calif.

[21] Appl. No.: 697,505

[22] Filed: May 3, 1991

Related U.S. Application Data

[63] Continuation of Ser. No. 456,019, Dec. 19, 1989, abandoned.

[51] Int. Cl.$^5$ .......................... H03B 5/12; H03B 5/18
[52] U.S. Cl. ........................................ 331/60; 331/75; 331/107 A; 331/117 FE; 331/117 D; 331/177 R
[58] Field of Search .................. 331/45, 60, 61, 74, 331/75, 107 A, 108 C, 108 D, 117 R, 117 FE, 117 D, 177 R, 177 V

[56] References Cited

U.S. PATENT DOCUMENTS

| | | | |
|---|---|---|---|
| 3,963,996 | 6/1976 | Skerlos | 331/108 D X |
| 4,688,005 | 8/1987 | Kipnis | 331/117 D X |
| 4,760,352 | 7/1988 | Ash | 331/107 A |
| 4,849,717 | 7/1989 | Fitzpatrick et al. | 331/108 D X |

Primary Examiner—Siegfried H. Grimm
Attorney, Agent, or Firm—Wanda K. Denson-Low

[57] ABSTRACT

A microwave voltage controlled oscillator (12) and isolation amplifiers (14, 16) are formed as a monolithic circuit on a single GaAs substrate. Only a single external inductor (34) is required to set the oscillation frequency. Optionally, an external resonator (38) may be used instead of an inductor. Off-chip active bias control (LIMin, 18) is provided for convenient frequency tuning.

13 Claims, 4 Drawing Sheets

MONOLITHIC MICROWAVE INTEGRATED CIRCUIT VOLTAGE CONTROLLED HARMONIC OSCILLATOR WITH ISOLATION AMPLIFIERS

This is a continuation of application Ser. No. 456,019, filed Dec. 19, 1989 now abandoned.

BACKGROUND OF THE INVENTION

1. Field of the Invention

The present invention relates generally to microwave integrated circuits, and, more particularly, to a voltage controlled oscillator with isolation amplifiers all deposited on a single or monolithic integrated circuit.

2. Description of the Prior Art

There are many situations in which microwave frequency sources with voltage control capability (so-called voltage controlled oscillators or just VCO) are required. Present day microwave integrated circuit (MIC) VCO circuits contain a number of non-monolithic lumped and distributed elements that require a considerable amount of "tuning up" to specification. By contrast, monolithic microwave integral circuit (MMIC) oscillator designs do not require "tuning up" to specification. Since they are produced monolithically, they may be generated inexpensively in large quantities. Yet, known MMIC oscillator designs to date have not taken advatange of the monolithic medium on which they are constructed which can support a very large number of active devices. These MMIC oscillator designs have consisted merely of old MIC designs forced into the monolithic technology form. This has resulted in inefficient use of the semiconductor substrate since large lumped and distributed elements are still used and occupy most of the monolithic die area. This, of course, drastically limits the number of functions that can be integrated on-chip which in conjunction with the labor intensive "tuning" problems makes production costs excessive.

Representative of present day efforts along these lines is U.S. Pat. No. 4,481,487, issued Nov. 6, 1984, for MONOLITHIC MICROWAVE WIDE-BAND VCO which discloses an MMIC oscillator circuit consisting of a single transistor with several distributed and lumped tuning elements. The latter are disadvantageous for reasons already given.

SUMMARY OF THE PRESENT INVENTION

A primary object and aim of the present invention is the provision of an oscillator constructed utilizing monolithic microwave integrated circuit technology including a single inductive element for setting frequency which may optionally be internal or external.

A further object is the provision of an oscillator as in the previous object in which the inductive element is replaced by an external resonator.

Another object of the invention is the provision of a monolithic microwave integrated circuit of a voltage controlled oscillator having a transparent oscillator mode and separate isolation/buffer amplifiers with built-in level shifting.

Yet another object is the provision, in accordance with the above objects, of a combination of a microwave voltage controlled oscillator with a high speed digital prescaler all constructed on a single semiconductor integrated circuit.

In accordance with the practice of the present invention a microwave voltage controlled harmonic oscillator and one or more isolation amplifiers is formed as an integrated circuit on a single gallium arsenide (GaAs) substrate. This eliminates hard wiring between the amplifiers and oscillator required in present known microwave oscillators and the necessity of extensive "tuning". Only a single external inductor is needed to establish the oscillation frequency. The monolithic construction makes the oscillator and buffers easily incorporated as a functional building block in other monolithic circuits.

Optionally, instead of an inductor for setting the oscillator frequency an external resonator may be used such as a dielectric resonator or surface acoustic wave (SAW) device.

An especially advantageous use of the invention is in phase-locked loop circuits since the oscillators with buffers may be placed on-chip with a high-speed GaAs prescaler/divider, thus providing on a single chip most functions required for microwave frequency phase-locked loops.

DESCRIPTION OF A PREFERRED EMBODIMENT

Figure 1:
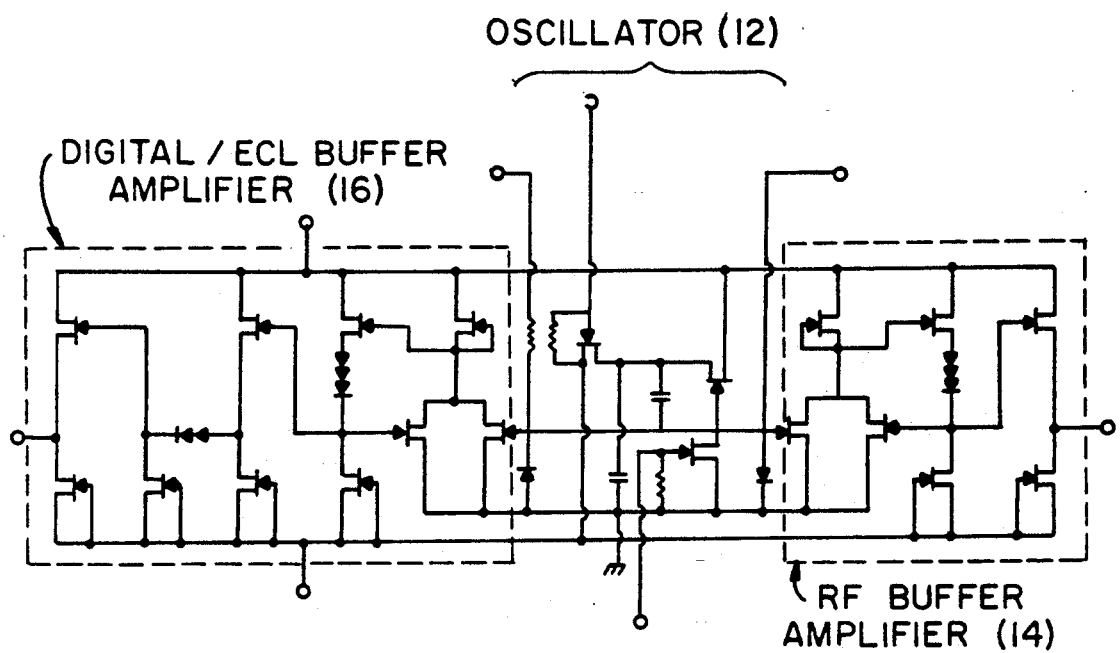
FIG. 1 is a schematic diagram of the complete monolithic microwave integrated circuit voltage control oscillator of the present invention.

Turning now to the drawings, and particularly FIG. 1, the circuit schematic of the monolithic microwave voltage controlled oscillator with buffers of the present invention is enumerated generally as 10 and is seen to include, in its major parts, a voltage controlled oscillator 12, an RF buffer amplifier 14, and a digital emitter-coupled-logic (ECL) buffer amplifier 16. The different circuit parts 12, 14 and 16 will be described individually prior to discussing operational results achieved.

Voltage Controlled Oscillator

Figure 2:
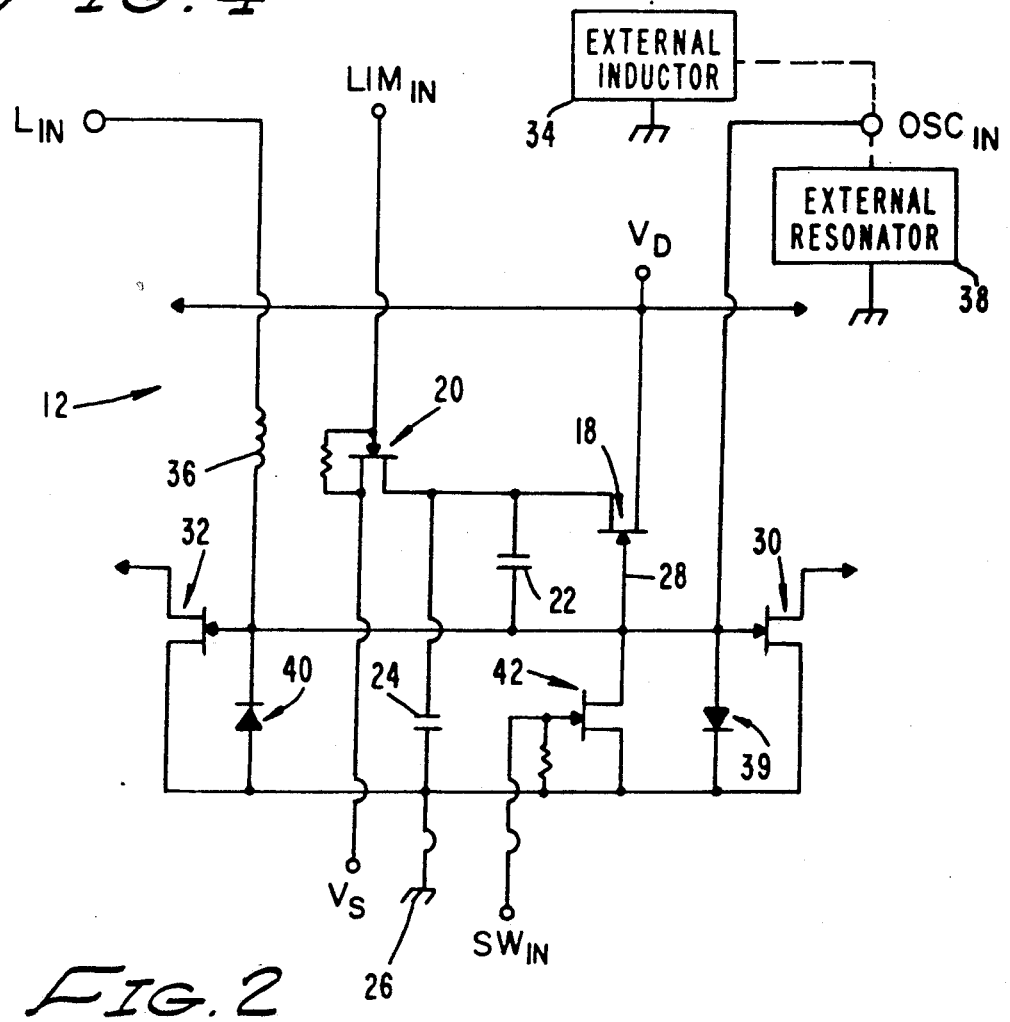
FIG. 2 is the oscillator portion of the circuit of FIG. 1.

FIG. 2 depicts the voltage controlled oscillator 12 of the FIG. 1 circuit in slightly enlarged form for ease of analysis. The design theory is to provide a broadband negative resistance which when appropriately loaded induces oscillation and will be recognized generally as what is termed a Colpitts oscillator. The primary oscillation transistor 18 is a MESFET (metal semiconductor field effect transistor) having its drain suitably biased by voltage Vd and its source interconnected with the drain of the FET 20, the source of the latter being suitably biased by Vs. In this way, the transistor 18 is actively biased as a source follower. This off-chip active bias control of 18 is particularly useful for frequency tuning.

Capacitor 22 is connected across the source and gate of transistor 18 and capacitor 24 interconnects from the transistor 18 source terminal to ground 26. The two capacitors 22, 24 form a voltage divider for a positive feedback path. A negative resistance is accordingly created at the gate 28 of transistor 18 which is also the oscillator input node (OSCin). Although two FETs 30 and 32 are shown as part of the oscillator circuit, they represent, in actuality, loading by the RF amplifier 14 and digital/ECL buffer amplifier 16, respectively, the capacitive inputs of which contribute only slightly to the overall capacitance existing at the OSCin node.

Oscillation is achieved by loading the OSCin node with an external inductive element 34, shown in dashed line, which can be either lumped or distributed. In a practical construction of the invention a bond wire was used as the inductive element.

It has been found that because of the high level of integration in the present invention there is sufficient room left on the die for a monolithic inductor 36. By shorting the inductor to ground (i.e., LIN to 26) oscillation can be initiated. Although a monolithic inductor is useful for test purposes, since such inductors have rather low quality factors, it is more desirable to use an external inductance such as 34 for achieving essential oscillation.

Still further, an external resonator 38 can be substituted for the external inductor 34. That is, a so-called Dielectric Resonator which is the most common resonator used in the microwave frequency range may be used, or for operation in the VHF/UHF range a surface acoustic wave (SAW) device can be used. Being able to select an internal inductor, an external inductive element, or an external resonator makes the present invention highly desirable from a commercial standpoint.

Schottky diodes 39 and 40 effect hard limiting of the oscillation voltage and in that way stabilize the output. Transistor 42 (MESFET) is also used for limiting and has operating characteristics such that when in its triode region, it appears as a 50 ohm resistor. Accordingly, when SWin is at zero bias, the oscillator is disabled, transparent and the OSCin node appears as a 50 ohm termination. This is especially useful during testing of the buffer stages.

Modulation of SWin near Vs values controls the oscillation amplitude. Modulation of the voltage signal at the LIMin node varies the bias of transistor 18 which causes the oscillator frequency to shift, and in that way achieves the desired voltage controlled tuning.

RF Buffer Amplifier

Figure 3:
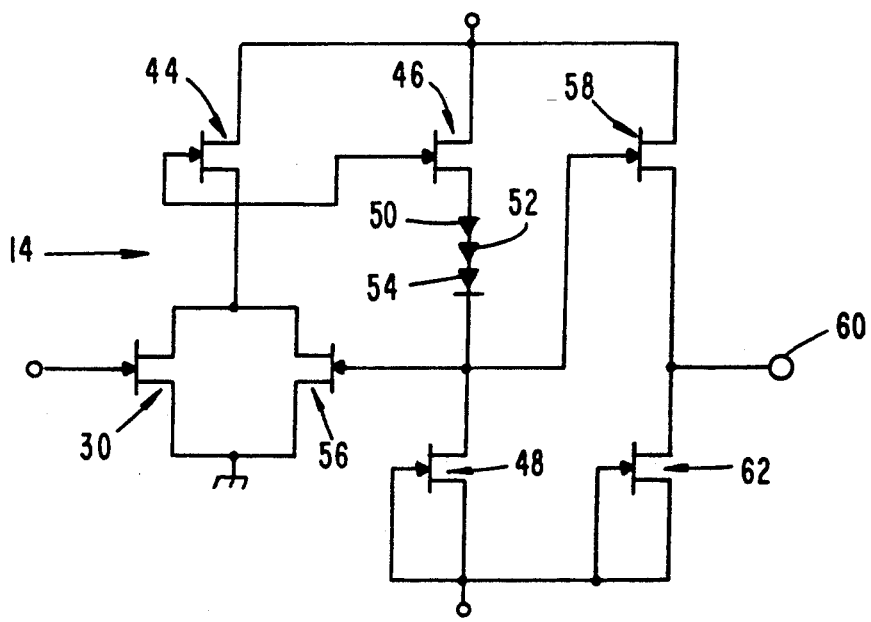
FIG. 3 is radio frequency output buffer portion of FIG. 1.

FIG. 3 shows the circuit for the RF buffer amplifier 14 which broadly is constructed using, in combination, active-feedback, as well as direct-coupled and active-matching techniques.

Input from the oscillator is fed to the gate terminal of MESFET 30 which operates as a common source amplifier actively biased by a further MESFET 44. The drain output of MESFET 30 drives the gate of MESFET 46 which serves as a source follower stage. Transistor 48 is an active load for 46, and Schottky diodes 50, 52 and 54 effect level shifting.

Active feedback is furnished by FET 56 to stabilize overall biasing and gain, while FET 58 is an additional source follower stage serving as output drive. The length and width of 58 are such that the output impedance at terminal 60 is actively matched to 50 ohm. Transistor 62 is an active load for 58.

Digital/ECL Buffer Amplifier

Figure 4:
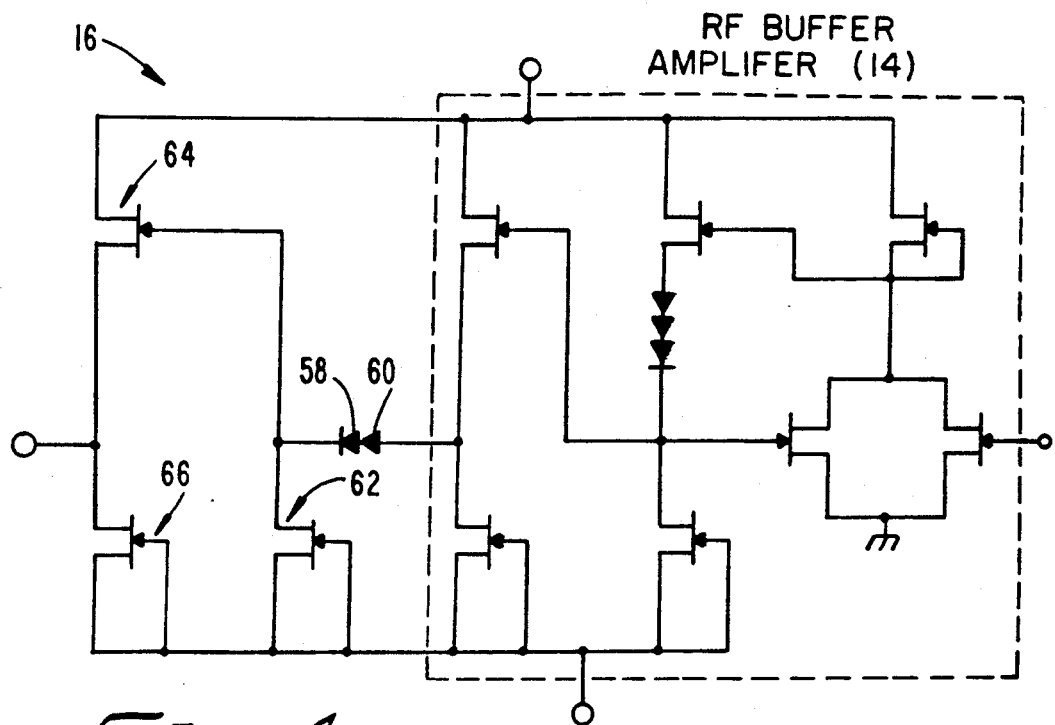
FIG. 4 is digital/ECL buffer circuit portion of FIG. 1.

This part of the circuit is shown in FIG. 4, much of which is identical to the RF buffer amplifier of FIG. 3. The primary differences are to enable obtaining appropriate level shifting. Although the RF buffer amplifier was contemplated for driving a zero biased load, the digital/ECL buffer amplifier is intended to drive loads requiring D.C. level shifts near −1.3 volts. This is accomplished by using a pair of diodes 58 and 60 with a current MESFET 62 which establishes a calibrated voltage drop. This level shift is maintained through an additional source follower stage defined by transistor 64 actively loaded by transistor 66.

This amplifier has several advantages making it ideal for oscillator buffering. First of all, its input is largely capacitive which produces little oscillator loading. In addition, large input signals at transistor 30 produce large voltage swings at the drain of 30 which forces 44 out of saturation, reducing its current source capability. The effect of this is a "soft" limiting of the input essentially causing the amplifier to stabilize its own output level.

The amplifier circuit provides 40 dB of isolation over a wide frequency range to prevent oscillator frequency pulling. This isolation is higher than that afforded by magnetic microwave isolators which are expensive, bulky and cannot be integrated monolithically.

It is not necessary for the buffer to work at frequencies higher than those at which high-speed dividers can operate and this is also true for the oscillator. Prescaler frequency response is determined by the GaAs fabrication process, which, in a practical construction, involved 1 $\mu$m MESFETs allowing operation to 2 GHz. Still further, the direct-coupled design allows buffer operation to very low frequencies (actually to D.C.) which is desirable for testing purposes.

Figure 5:
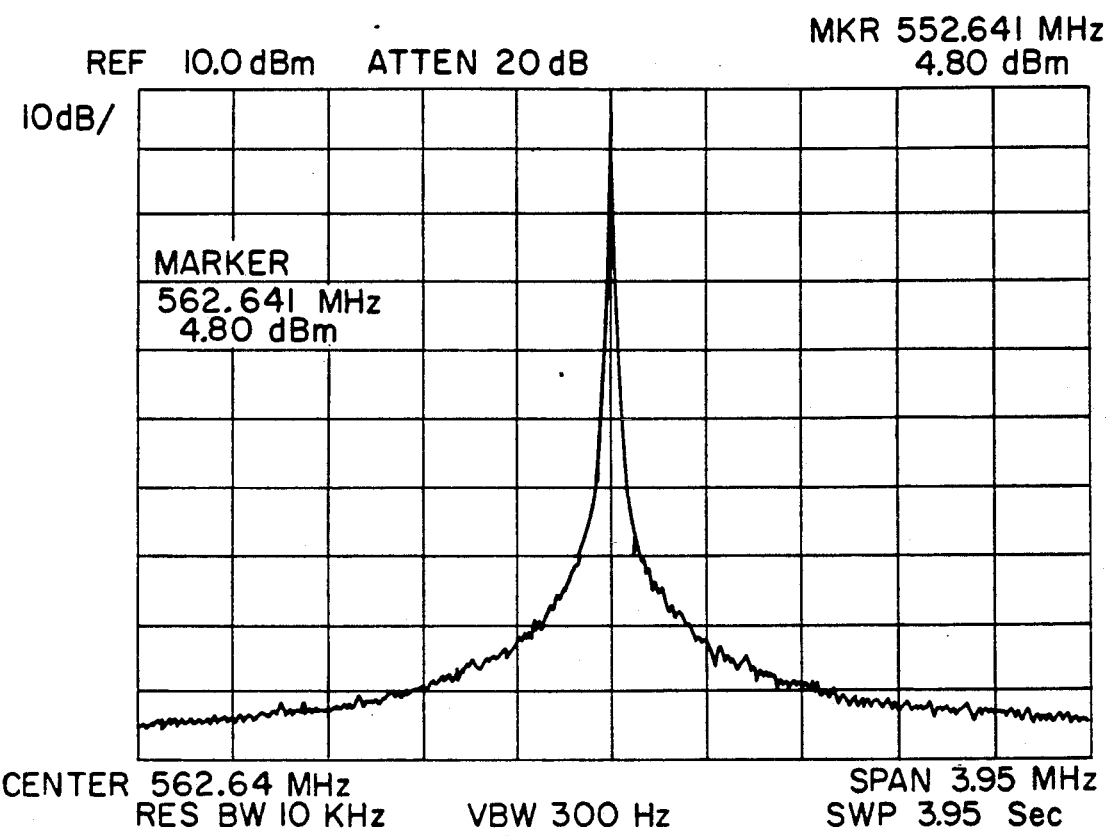
FIGS. 5 and 6 are graphs demonstrating operation at two different frequencies.
Figure 6:
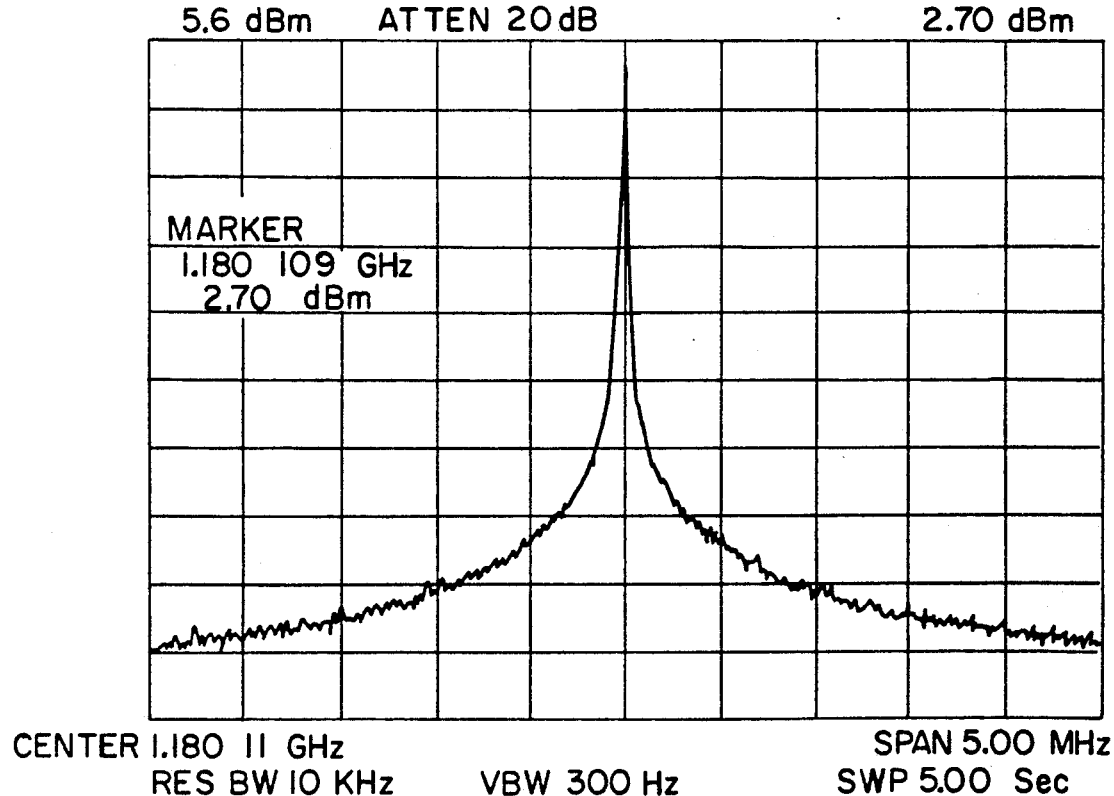
Figure 7:
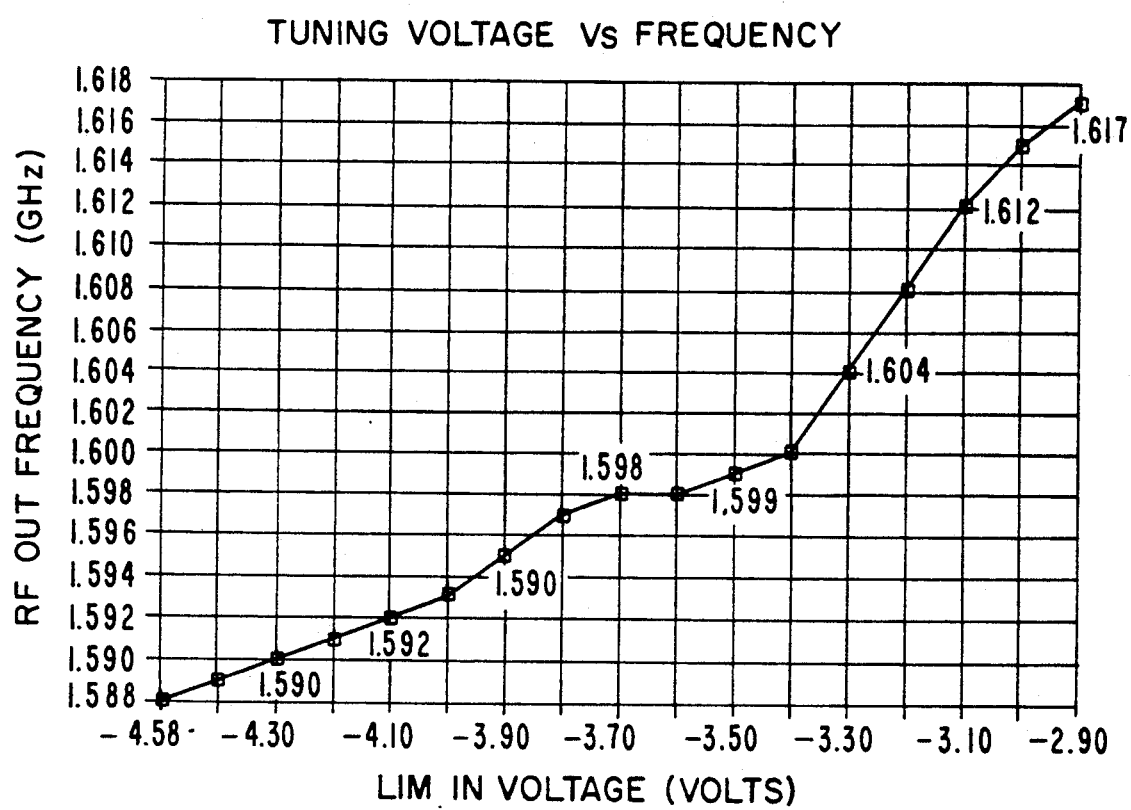
FIG. 7 is graph of oscillator frequency change on LIM in modulation.

A practical construction of the FIG. 1 circuit was monolithically integrated with a high-speed GaAs prescaler. FIGS. 5 and 6 graphically depict operation about 562 MHz and 1.18 GHz, respectively. FIG. 7 shows tuning characteristics obtained about 1.6 GHz.

Figure 8:
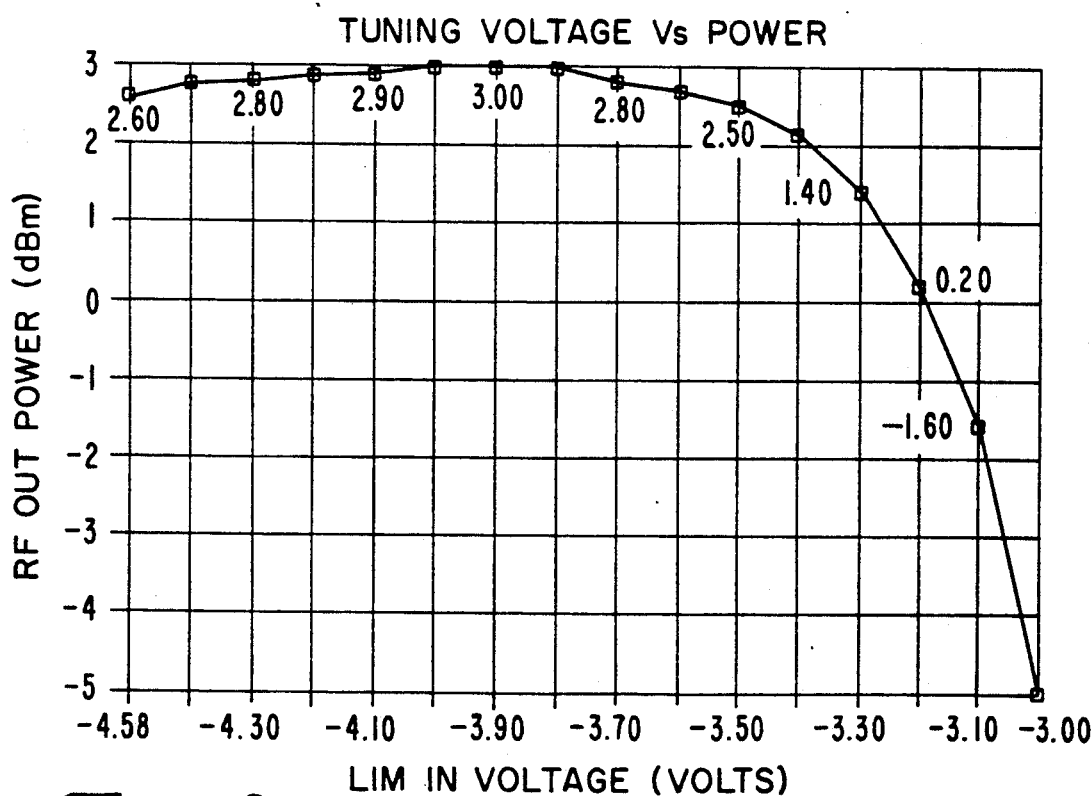
FIG. 8 shows corresponding power variation.

FIG. 8 depicts changes in output power tuning voltage. The tuning range of the described device is more than sufficient for phase locking. Examination of the RF buffer amplifier with a network analyzer shows that acceptable input and output voltage standing wave ratios (VSWR) were obtained, that the buffer amplifier provides 40 dB isolation for the oscillator and that buffer gain is maintained very close to unity (0 dB).

Although the present invention has been described in connection with a preferred embodiment, it is to be understood that those skilled in the art will recognize other embodiments, changes, variations and configurations that can be utilized and still remain within the spirit of the invention.

What is claimed is:

1. Monolithic microwave circuit apparatus comprising:
    a voltage controlled oscillator including a first field effect transistor having a source, a drain and a gate, the drain of said first transistor being positively biased with respect to the source of said first transistor,
    a second field effect transistor having a source, a drain and a gate, the drain of the second transistor being connected to the source of the first transistor, the source of said second transistor being negatively biased with respect to the drain of said second transistor,
    a capacitive voltage divider interconnecting the source and gate of the first transistor forming positive feedback for the first transistor; and first and second buffer amplifiers interconnected on-chip with the oscillator.

2. Monolithic microwave circuit apparatus as in claim 1, in which the second buffer amplifier is for driving loads requiring D.C. level shifts near a predetermined voltage level.

3. Monolithic microwave circuit apparatus as in claim 1, in which the oscillator, first buffer amplifier and second buffer amplifier are on a single GaAs substrate.

4. Monolithic microwave circuit apparatus as in claim 1, in which an external inductive element interconnects with the voltage controlled oscillator to establish the oscillator frequency.

5. Monolithic microwave circuit apparatus as in claim 4, in which the inductive element is a bond wire.

6. Monolithic microwave circuit apparatus as in claim 1, in which an external resonator interconnects with the voltage controlled oscillator to establish oscillator frequency.

7. Monolithic microwave circuit apparatus as in claim 6, in which the resonator is a dielectric resonator.

8. Monolithic microwave circuit apparatus as in claim 6, in which the resonator is a surface acoustic wave device for establishing oscillator operation in the VHF/UHF frequency range.

9. Monolithic microwave circuit apparatus as in claim 1, in which the oscillator has a terminal via which an off-chip signal effects bias control for oscillator frequency tuning.

10. Monolithic microwave circuit apparatus as in claim 1, in which first and second Schottky diodes each interconnect the first field effect transistor gate and circuit ground, said diodes being arranged in opposite conduction connection to each other.

11. Monolithic microwave circuit apparatus as in claim 1, in which a third field effect transistor has its drain and source serially connected between the first field effect transistor and ground, a bias terminal connected to the third transistor gate; said oscillator being disabled and transparent at zero bias.

12. Monolithic microwave circuit apparatus as recited in claim 1 further including an external inductor connected to the gate of the first transistor.

13. Monolithic microwave circuit apparatus as recited in claim 1 further including an external resonator connected to the gate of the first transistor.

* * * * *